US010530253B2

(12) United States Patent
Fujii et al.

(10) Patent No.: US 10,530,253 B2
(45) Date of Patent: Jan. 7, 2020

(54) DC/DC CONVERTER HAVING FAILURE DETECTION BASED ON VOLTAGE SENSOR VALUES

(71) Applicant: Mitsubishi Electric Corporation, Tokyo (JP)

(72) Inventors: Hiroya Fujii, Tokyo (JP); Hiroaki Tanihara, Tokyo (JP); Mitsuyasu Kunihiro, Tokyo (JP); Nobuhiro Kihara, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 0 days.

(21) Appl. No.: 16/133,863

(22) Filed: Sep. 18, 2018

(65) Prior Publication Data
US 2019/0305681 A1    Oct. 3, 2019

(30) Foreign Application Priority Data
Mar. 28, 2018 (JP) .................................. 2018-061142

(51) Int. Cl.
H02M 3/158    (2006.01)
G01R 31/40    (2014.01)

(52) U.S. Cl.
CPC ............ *H02M 3/158* (2013.01); *G01R 31/40* (2013.01)

(58) Field of Classification Search
CPC .............. H02M 3/158; H02M 5/4585; H02M 2001/322; H02M 2001/325; G01R 31/40; B60L 3/0038; B60L 3/0092; B60W 20/50; H02H 1/00; H02H 1/003; H02H 1/007; H02H 3/20; H02H 3/202; H02H 11/006; H02H 11/007
See application file for complete search history.

(56) References Cited

U.S. PATENT DOCUMENTS

| 6,427,100 | B1 * | 7/2002 | Kaku ................... B60L 3/0038 701/22 |
| 2003/0117823 | A1 * | 6/2003 | Sato .................... H02M 5/4585 363/132 |
| 2013/0119961 | A1 | 5/2013 | Okuda et al. |
| 2015/0263624 | A1 * | 9/2015 | Nobe .................... H02M 3/158 323/299 |

(Continued)

FOREIGN PATENT DOCUMENTS

| JP | 2004364404 A | * | 12/2004 |
| JP | 2004364404 A |   | 12/2004 |

(Continued)

OTHER PUBLICATIONS

Communication dated Dec. 25, 2018, from Japanese Patent Office in counterpart application No. 2018-061142.

Primary Examiner — Jeffrey A Gblende
Assistant Examiner — Jye-June Lee
(74) Attorney, Agent, or Firm — Sughrue Mion, PLLC; Richard C. Turner

(57) ABSTRACT

The DC/DC converter is provided with a failure detector that detects a failure in at least one of a first output-side voltage sensor, a second output-side voltage sensor, and an input-side voltage sensor, based on the respective detection values of the input-side voltage sensor, the first output-side voltage sensor, the second output-side voltage sensor, and a DC power source voltage sensor.

16 Claims, 5 Drawing Sheets

(56) References Cited

U.S. PATENT DOCUMENTS

| | | | | |
|---|---|---|---|---|
| 2016/0065073 A1* | 3/2016 | Katsuki | ................. | H02M 3/158 |
| | | | | 323/271 |
| 2017/0267231 A1* | 9/2017 | Takakura | .............. | B60W 20/50 |
| 2017/0313197 A1* | 11/2017 | Yamada | .................. | H02M 1/32 |
| 2018/0316259 A1* | 11/2018 | Tsujii | .................... | H02M 3/158 |

FOREIGN PATENT DOCUMENTS

| | | | |
|---|---|---|---|
| JP | 2007330089 A | 12/2007 | |
| JP | 5457559 B2 | 4/2014 | |

\* cited by examiner

DC/DC CONVERTER HAVING FAILURE DETECTION BASED ON VOLTAGE SENSOR VALUES

BACKGROUND OF THE INVENTION

Field of the Invention

The present application relates to a DC/DC converter.

Description of the Related Art

A DC/DC converter capable of performing bidirectional electric-power conversion between a DC low-voltage side and a DC high-voltage side is well known. A conventional DC/DC converter disclosed in Patent Document 1 has a group of terminals, a reactor, and a switching-device series circuit; the conventional DC/DC converter steps up or down a DC voltage from a battery and then supplies the DC voltage to an electric motor.

In the foregoing conventional DC/DC converter, the group of terminals has a first terminal and a second terminal; the switching-device series circuit includes a first switching device and a second switching device that are connected in series with each other. The connection point between the first switching device and the second switching device is connected with the first terminal by way of the reactor, and the side opposite to the foregoing connection point is connected with the second terminal; the first terminal is at the low-voltage side and the second terminal is at the high-voltage side. The conventional DC/DC converter configured in such a manner as described above performs DC-voltage conversion operation between the low-voltage side and the high-voltage side.

The foregoing conventional DC/DC, converter has a calculation means and an opening/closing control means for performing opening/closing control of switching devices. The calculation means calculates a calculation value, based on a voltage difference between a high-voltage-side voltage command value and a high-voltage-side voltage detection value or a voltage difference between a low-voltage-side voltage command value and a low-voltage-side voltage detection value; the opening/closing control means obtains a conduction rate based on the calculation value calculated by the calculation means and then controls switching operations by the first switching device and the second switching device, based on the conduction rate.

The foregoing conventional DC/DC converter has two high-voltage-side voltage sensors for detecting high-voltage-side voltages, so that a failure in the DC/DC converter circuit, due to a failure of the voltage sensor, is prevented and the DC/DC converter can continuously be controlled. The determination on a failure in each of these high-voltage-side voltage sensors is performed based on a comparison between a high-voltage-side estimation voltage and the high-voltage-side voltage detected by each of the two high-voltage-side voltage sensors.

In the case where as the result of the foregoing failure determination, no failure exists in any one of both the high-voltage-side voltage sensors, the mode of the DC/DC converter is set to a normal mode, and switching control of the switching devices is performed so that voltage conversion is implemented; in the case where a failure exists in one of the high-voltage-side voltage sensors, the appropriateness of the high-voltage-side voltage cannot be determined; therefore, the second switching device is fixed to an ON state and the other high-voltage-side voltage sensor detects the high-voltage-side voltage, so that the failure in the one of the high-voltage-side voltage sensors is detected.

PRIOR ART REFERENCE

Patent Document

[Patent Document 1] Japanese Patent Publication No. 5457559

The conventional DC/DC converter performs determination on a failure in the two high-voltage-side voltage sensors for detecting the high-voltage-side voltage in such a manner as described above; however, in the case where each of the two high-voltage-side voltage sensors has a failure that the output thereof is fixed within the outputtable range, it may erroneously be determined that the two high-voltage-side voltage sensors for detecting the high-voltage-side voltage are normal and a low-Voltage-side voltage sensor for detecting the low-voltage-side voltage has a failure. In this situation, in fact, each of the high-voltage-side voltage sensors has a failure; thus, when the operation of a rotating electric machine connected with the DC/DC converter changes from the electric power generator mode to the motor mode, or vice versa, the operation of the rotating electric machine is continuously performed under the condition that a change in the high-voltage-side voltage of the DC/DC converter cannot be detected. As a result, there has been a problem that when the high-voltage-side voltage becomes excessively large, the DC/DC converter circuit is broken and that when in contrast, the high-voltage-side voltage becomes excessively small, the voltage necessary to control the motor is insufficient and hence the DC/DC converter becomes uncontrollable.

The present application has been made in order to solve the foregoing problem in a conventional DC/DC converter; the objective thereof is to provide a DC/DC converter in which even when the high-voltage-side voltage sensor for detecting the high-voltage-side voltage fails, no failure occurs in the circuit and that does not become uncontrollable.

SUMMARY OF THE INVENTION

A DC/DC converter disclosed in the present application includes a DC/DC converter main body that performs voltage conversion operation for converting a DC input-side voltage into a DC output-side voltage having a different value and a control apparatus that controls the voltage conversion operation by the DC/DC converter main body; the DC/DC converter is characterized
  in that the DC/DC converter main body includes
    an input terminal with which a DC power source is connected,
    a reactor whose one end is connected with the input terminal,
    a switching circuit in which a first switching device and a second switching device are provided and in which the other end of the reactor is connected with a connection portion between the first switching device and the second switching device,
    an energy accumulation means that accumulates energy of the reactor, generated through switching operation by the first switching device, via the second switching device,
    an output terminal from which a voltage of the energy accumulation means is outputted as the output-side voltage, an input-side voltage sensor that detects the input-side voltage, a first output-side voltage sensor that detects the output-side voltage, a second output-side voltage sensor that detects the output-side voltage, and a DC power source voltage sensor that detects a voltage of the DC power source, in that based on a command value from the outside, a detection value of the input-side voltage sensor, and at least one of a detection value of the first output-side voltage sensor and a detection value of the second output-side voltage sensor, the control apparatus controls switching of the first switching device and the second switching device, thereby controlling the voltage conversion operation, in that the control apparatus further has a failure detection means that detects a failure That least one of the input-side voltage sensor, the first output-side voltage sensor, and the second output-side voltage sensor, and in that the failure detection means performs a determination on the failure, based on a detection value of the input-side voltage sensor, a detection value of the first output-side voltage sensor, a detection value of the second output-side voltage sensor, and a detection value of the DC power source voltage sensor.

With regard to the control apparatus in the DC/DC converter disclosed in the present application, based on a command value from the outside, a detection value of the input-side voltage sensor, and at least one of a detection value of the first output-side voltage sensor and a detection value of the second output-side voltage sensor, the control apparatus controls switching of the first switching device and the second switching device, thereby controlling the voltage conversion operation; the control apparatus further has a failure detection means that detects a failure in at least one of the input-side voltage sensor, the first output-side voltage sensor, and the second output-side voltage sensor; the failure detection means performs a determination on the failure, based on a detection value of the input-side voltage sensor, a detection value of the first output-side voltage sensor, a detection value of the second output-side voltage sensor, and a detection value of the DC power source voltage sensor. As a result, there can be obtained a DC/DC converter in which even when the high-voltage-side voltage sensor for detecting the high-voltage-side voltage fails, no failure occurs in the circuit and that does not become uncontrollable.

The foregoing and other object, features, aspects, and advantages of the present invention will become more apparent from the following detailed description of the present invention when taken in conjunction with the accompanying drawings.

DETAILED DESCRIPTION OF THE PREFERRED EMBODIMENTS

Embodiment 1

Figure 1:
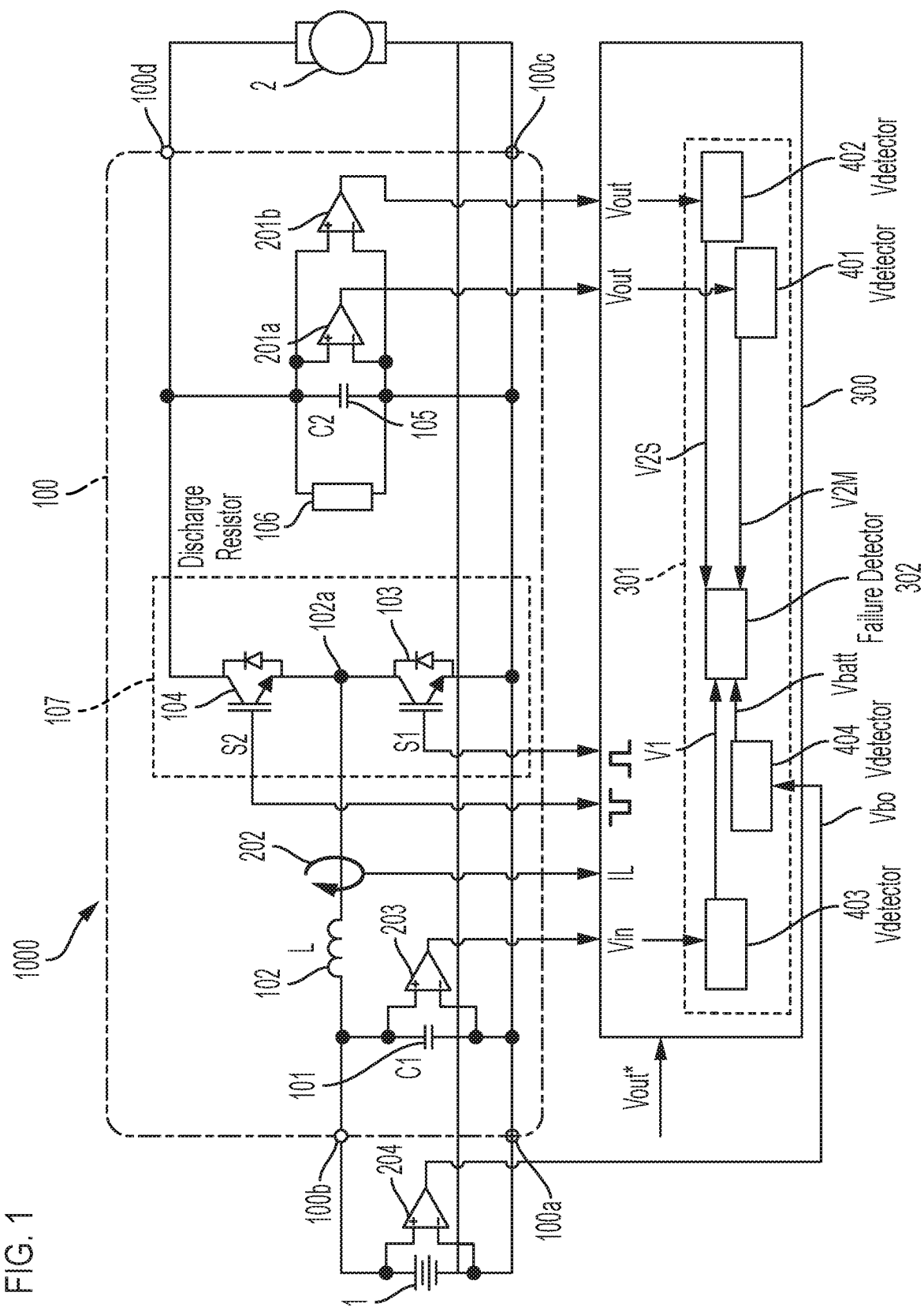
FIG. 1 is a configuration diagram representing a DC/DC converter according to Embodiment 1.

FIG. 1 is a configuration diagram representing a DC/DC converter according to Embodiment 1. In FIG. 1, a DC/DC converter 1000 includes a DC/DC converter main body 100 and a control apparatus 300 for control ling the DC/DC converter main body 100. The DC/DC converter main body 100 has a function as a DC power conversion apparatus for converting electric power between DC voltages, and includes a reactor 102, a semiconductor module 107, a low-voltage side capacitor 101, a high-voltage side capacitor 105 as an energy accumulator, and a high-voltage-side discharging resistor 106.

The semiconductor module 107 includes a first switching device 103, as a low-voltage-side semiconductor switching device, and a second switching device 104, as a high-voltage-side semiconductor switching device. The first switching device 103 and the second switching device 104 are connected in series with each other and included in a switching circuit of the DC/DC converter main body 100.

As described later, the control apparatus 300 performs switching control of the first switching device 103 and the second switching device 104. Each of the first switching device 103 and the second switching device 104 is formed, for example, of an IGBT (Insulated Gate Bipolar Transistor) with which a free-wheel diode is connected in an anti-parallel manner.

In Embodiment 1, the first switching device 103 of the semiconductor module 107 is turned on when a first gate signal S1 is high-level and is turned off when the first gate signal S1 is low-level. Similarly, the second switching device 104 is turned on and turned off when a second gate signal S2 is high-level and low-level, respectively.

One terminal of the first switching device 103 is connected with the negative-polarity terminal of the low-voltage-side capacitor 101; the other terminal thereof is connected with the positive-polarity terminal of the low-voltage-side capacitor 101 by way of the reactor 102. One terminal of the second switching device 104 is connected with the other terminal of the first switching device 103; the other terminal thereof is connected with the positive-polarity terminal of the high-voltage-side capacitor 105. The negative-polarity terminal of the high-voltage-side capacitor 105 is connected with the one terminal of the first switching device 103. The foregoing high-voltage-side discharging resistor 106 is connected in parallel with the high voltage-side capacitor 105.

The low-voltage side capacitor 101 smooths a low-voltage-side voltage, which is the input-side voltage of the DC/DC converter main body 100. The reactor 102 produces energy to be accumulated in the high-voltage-side capacitor 105. The semiconductor module 107 including the first switching device 103 and the second switching device 104 steps up the low-voltage-side voltage, which is the input-side voltage, to a high voltage-side voltage, which is the output-side voltage. The high-voltage-side capacitor 105 smooths the high-voltage-side voltage, which is the output-side voltage of the DC/DC converter main body 100. The high-voltage-side discharging resistor 106 is utilized for discharging electric charges as the energy accumulated in the high-voltage-side capacitor 105.

A battery 1, as a DC power source that outputs the high-voltage-side voltage, is connected between a low-voltage-side negative-polarity terminal 100a and low-voltage-side positive-polarity terminal 100b, as the input terminals of the DC/DC converter main body 100. A rotating electric machine 2 provided with a function as a motor and a function as an electric power generator is connected between a high-voltage-side negative-polarity terminal 100c and a high-voltage-side positive-polarity terminal 100d, as the output terminals of the DC/DC converter main body 100.

The rotating electric machine 2 has an inverter (unillustrated) for controlling the output from the DC/DC converter main body 100; in FIG. 1, the rotating electric machine 2 is represented as the one including the foregoing inverter. In other words, the rotating electric machine 2 is supplied with DC electric power by the DC/DC converter main body 100 electrically connected with the inverter and then generates driving force; alternatively, the rotating electric machine 2 converts generated AC electric power into DC electric power by use of the foregoing inverter and then supplies the DC electric power to the battery 1 by way of the DC/DC converter main body 100.

The foregoing inverter configures a DC/AC converter that performs electric-power conversion between DC electric power, which is the output of the DC/DC converter main body 100 as a DC power source, and AC electric power, which is the output of the rotating electric machine 2. The foregoing inverter has a 3-phase bridge circuit (unillustrated) whose DC-side input terminals are connected between a positive-polarity conductor connected with the high-voltage-side positive-polarity terminal 100d of the DC/DC converter main body 100 and a negative-polarity conductor connected with the high-voltage-side negative-polarity terminal 100c of the DC/DC converter main body 100.

The positive-polarity DC terminal of the 3-phase bridge circuit in the foregoing inverter is connected with the high-voltage-side positive-polarity terminal 100d of the DC/DC converter main body 100, and the negative-polarity DC terminal is connected with the high-voltage-side negative-polarity terminal 100c of the DC/DC converter main body 100; A U-phase arm including a U-phase upper arm semiconductor switching device and a U-phase lower arm semiconductor switching device that are connected in series with each other, a V-phase arm including a V-phase upper arm semiconductor switching device and a V-phase lower arm semiconductor switching device that are connected in series with each other, and a W-phase arm including a W-phase upper arm semiconductor switching device and a W-phase lower arm semiconductor switching device that are connected in series with each other are connected in parallel with one another between the positive-polarity DC terminal and the negative-polarity DC terminal.

A U-phase output terminal pulled out from a portion where the U-phase upper arm semiconductor switching device and the U-phase lower arm semiconductor switching device are connected in series with each other is connected with a U-phase armature winding terminal of the rotating electric machine 2; a V-phase output terminal pulled out from a portion where the V-phase upper arm semiconductor switching device and the V-phase lower arm semiconductor switching device are connected in series with each other is connected with a V-phase armature winding terminal of the rotating electric machine 2; a W-phase output terminal pulled out from a portion where the U-phase upper arm semiconductor switching device and the W-phase lower arm semiconductor switching device are connected in series with each other is connected with a W-phase armature winding terminal of the rotating electric machine 2.

As each of the foregoing U-phase upper arm semiconductor switching device, the U-phase lower arm semiconductor switching device, the V-phase upper arm semiconductor switching device, the V-phase lower arm semiconductor switching device, the W-phase upper arm semiconductor switching device, and the W-phase lower arm semiconductor switching device, a semiconductor chip such as an IGBT with which a free-wheel diode is connected in an anti-parallel manner, a MOSFET (Metal Oxide Semiconductor Field Effect Transistor), or the like is utilized.

In FIG. 1, a system including a single rotating electric machine 2 is represented; however, the system may include two rotating electric machines 2. In that case, one of the two rotating electric machines 2 is utilized as a driving-side rotating electric machine 2, i.e., as a motor, and the other one thereof is utilized as an electric power generator.

The DC/DC converter main body 100 has a first high-voltage-side voltage sensor 201a, as a first output-side voltage sensor, for detecting the high-voltage-side voltage, which is a voltage between the positive polarity and the negative polarity of the high-voltage-side capacitor 105, a second high-voltage-side voltage sensor 201b, as a second output-side voltage sensor, for detecting the high-voltage-side voltage, which is a voltage between the positive polarity and the negative polarity of the high-voltage-side capacitor 105, a low-voltage-side voltage sensor 203, as an input-side voltage sensor, for detecting the low-voltage-side voltage, which is a voltage between the positive polarity and the negative polarity of the low-voltage-side capacitor 101, and a current sensor 202 for detecting a current flowing in the reactor 102. The output voltage of the battery is detected by a battery voltage sensor 204 as a DC power source voltage sensor.

The control apparatus 300 generates the first gate signal S1 and provides the first gate signal S1 to the first switching device 103 so as to make the first switching device 103 perform on/off operation; the control apparatus 300 generates the second gate signal S2 and provides the second gate signal S2 to the second switching device 104 so as to make the second switching device 104 perform on/off operation. The control apparatus 300 makes the second gate signal S2 low-level when making the first gate signal S1 high-level and makes the second gate signal S2 high-level when making the first gate signal S1 low-level.

The control apparatus 300 is provided with a failure detection means 301 as a failure detector. The failure detection means 301 has a failure detector 302, a first high-voltage-side voltage detector 401 as a first output-side voltage detector, a second high-voltage-side voltage detector 402 as a second output-side voltage detector, a low-voltage-side voltage detector 403 as an input-side voltage detector, and a battery voltage detector 404 as a DC power source voltage detector. Each of the failure detector 302, the first high-voltage-side voltage detector 401, the second high-voltage-side voltage detector 402, the low-voltage-side voltage detector 403, and the battery voltage detector 404 in the failure detection means 301 is formed of, for example, a software program stored in a ROM (Read Only Memory); each of them is periodically read from the ROM in a predetermined period so as to implement after-mentioned processing or is read from the ROM, as may be necessary, so as to implement the after-mentioned processing.

Figure 5:
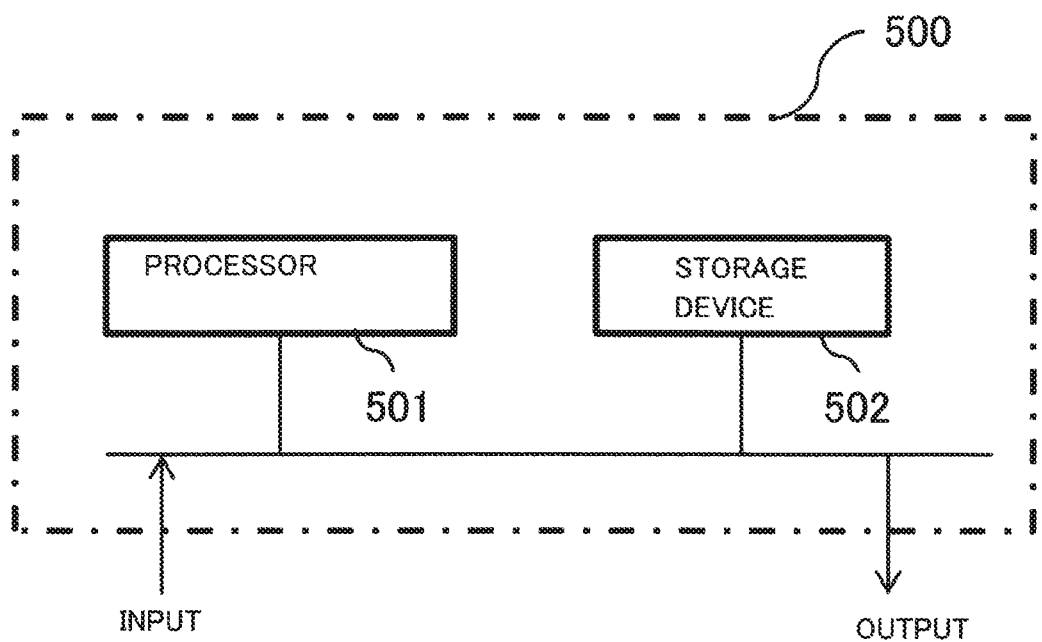
FIG. 5 is an example of hardware of the processing apparatus in the failure detection means, in the DC/DC converter according to Embodiment 1.

FIG. 5 shows an example of hardware of the processing apparatus 500 in the failure detection means 301, as the failure detector 302, the first high-voltage-side voltage detector 401, the second high-voltage-side voltage detector 402, the low-voltage-side voltage detection means 301. The processing apparatus 500 is composed of a processor 501 and a storage unit 502 as shown in FIG. 5. The storage unit 502 includes, although not shown, a volatile storage device such as a random access memory, and a nonvolatile auxiliary storage device such as a flash memory. The storage unit 502 may include, instead of a flash memory, an auxiliary storage device such as a hard disk. The processor 501 executes a program loaded from the storage unit 502. In this case, the program is loaded from the auxiliary storage device to the processor 501 via the volatile storage device. The processor 501 may output data of the calculation result and the like to the volatile storage device of the storage unit 502, or may store the data in the auxiliary storage device via the volatile storage device.

The first high-voltage-side voltage detector 401 receives a detection value Vout of the voltage across the high-voltage-side capacitor 105 from the first high-voltage-side voltage sensor 201a and then outputs a first high-voltage-side detection voltage V2M, as a first output-side detection voltage, calculated based on the inputted detection value Vout. The second high-voltage-side voltage detector 402 receives a detection value Vout of the voltage across the high-voltage-side capacitor 105 from the second high-voltage-side voltage sensor 201b and then outputs a second high-voltage-side detection voltage V2S, as a second output-side detection voltage, calculated based on the inputted detection value Vout.

The low-voltage-side voltage detector 403 receives a detection value Vin of the voltage across the low-voltage-side capacitor 101 from the low-voltage-side voltage sensor 203 and outputs a low-voltage-side detection voltage V1, as an input-side detection voltage, calculated based on the inputted detection value Vin. The battery voltage detector 404 receives a detection value Vbo of the voltage of the battery 1 from the battery voltage sensor 204 and outputs a battery detection voltage Vbatt, as a DC power source detection voltage, calculated based on the inputted detection value Vbo.

The failure detector 302 receives the first high-voltage-side detection voltage V2M outputted from the first high-voltage-side voltage detector 401, the second high-voltage-side detection voltage V2S outputted from the second high-voltage-side voltage detector 402, the low-voltage-side voltage detection value V1 outputted form the low-voltage-side voltage detector 403, and the battery detection value Vbatt outputted from the battery voltage detector 404.

The DC/DC converter 1000 according to Embodiment 1, configured in such a manner as described above, is a bidirectional DC/DC converter that can perform bidirectional electric-power conversion between the low voltage side and the high voltage side; the DC/DC converter 1000 steps up a low-voltage-side voltage, as an input-side voltage inputted between the low-voltage-side negative-polarity terminal 100a and the low-voltage-side positive-polarity terminal 100b, to a voltage that is the same as or higher than the low-voltage-side voltage and then outputs a high-voltage-side voltage, as an output-side voltage that has been stepped up, between the high-voltage-side negative-polarity terminal 100c and the high-voltage-side positive-polarity terminal 100d.

In other words, as its steady-state operation, the DC/DC converter 1000 operates in such a way as to make the first switching device 103 turn on and the second switching device 104 turn off so as to energize the reactor 102 and in such a way as to make the first switching device 103 turn off and the second switching device 104 turn on so as to make the reactor 102 generate energy and then to make the high-voltage-side capacitor 105 accumulate the energy.

As described above, alternate on/off of the first switching device 103 and the second switching device 104 is repeated, so that energy is accumulated in the high-voltage-side capacitor 105 and a high-voltage-side voltage, which has been stepped up to a voltage the same as or higher than the low-voltage-side voltage, is outputted between the high-voltage-side positive-polarity terminal 100d and the high-voltage-side negative-polarity terminal 100c. The control apparatus 300 changes the duty rates of the high level to the low level in each of the first gate signal S1 and the second gate signal S2 so as to change the on/off period of each of the first switching device 103 and the second switching device 104; as a result, it is made possible that the value of the high-voltage-side voltage, as an output voltage, can be controlled in such a way as to keep track of a high-voltage-side voltage command value Vout*, as a command value inputted from the outside.

Figure 2:
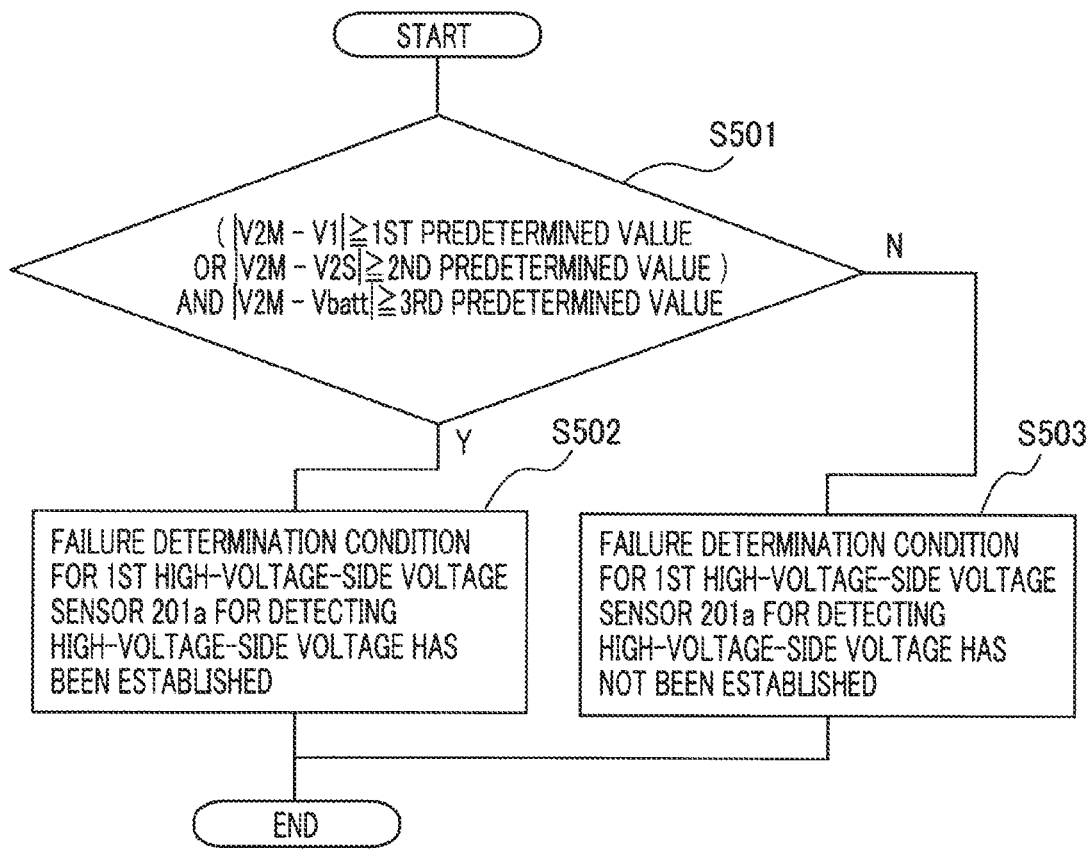
FIG. 2 is a flowchart representing the processing flow of a failure determination on a first high-voltage-side voltage sensor in the DC/DC converter according to Embodiment 1.

Next, there will be explained a failure determination on the first high-voltage-side voltage sensor 201a, performed by the failure detection means 301 provided in the control apparatus 300. FIG. 2 is a flowchart representing the processing flow of the failure determination on the first high-voltage-side voltage sensor in the DC/DC converter according to Embodiment 1.

In FIG. 2, in the step S501, the failure detector 302 performs a determination [whether or not the absolute value of the difference between the first high-voltage-side detection voltage V2M and the low-voltage-side detection voltage V1 is the same as or larger than a first predetermined value], a determination [whether or not the absolute value of the difference between the first high-voltage-side detection voltage V2M and the second high-voltage-side detection voltage V2S is the same as or larger than a second predetermined value], and a determination [whether or not the absolute value of the difference between the first high-voltage-side detection voltage V2M and the battery detection voltage Vbatt is the same as or larger than a third predetermined value]. In this situation, the first predetermined value, the second predetermined value, and the third predetermined value are respective preliminarily set values and are different from one another.

In the case where in the determinations in the step S501, it is determined that [the absolute value of the difference between the first high-voltage-side detection voltage V2M and the low-voltage-side detection voltage V1 is the same as or larger than the preliminarily set first predetermined value] or that [the absolute value of the difference between the first high-voltage-side detection voltage V2M and the second high-voltage-side detection voltage V2S is the same as or larger than the preliminarily set second predetermined value] and it is determined that [the absolute value of the difference between the first high-voltage-side detection voltage V2M and the battery detection voltage Vbatt is the same as or larger than the preliminarily set third predetermined value] (Y) the step S501 is followed by the step S502, where it is determined that because the failure determination condition for the first high-voltage-side voltage sensor 201a for detecting the high-voltage-side voltage is established, the first high-voltage-side voltage sensor 201a has a failure.

In the case where in the determinations in the step S501, it is determined that [the absolute value of the difference between the first high-voltage-side detection voltage V2M and the low-voltage-side detection voltage V1 is smaller than the preliminarily set first predetermined value] and that [the absolute value of the difference between the first high-voltage-side detection voltage V2M and the second high-voltage-side detection voltage V2S is smaller than the preliminarily set second predetermined value] and it is further determined that [the absolute value of the difference between the first high-voltage-side detection voltage V2M and the battery detection voltage Vbatt is smaller than the preliminarily set third predetermined value] (N), the step S501 is followed by the step S503, where it is determined that because the failure determination condition for the first high-voltage-side voltage sensor 201a for detecting the high-voltage-side voltage is not established, the first high-voltage-side voltage sensor 201a is normal.

Figure 3:
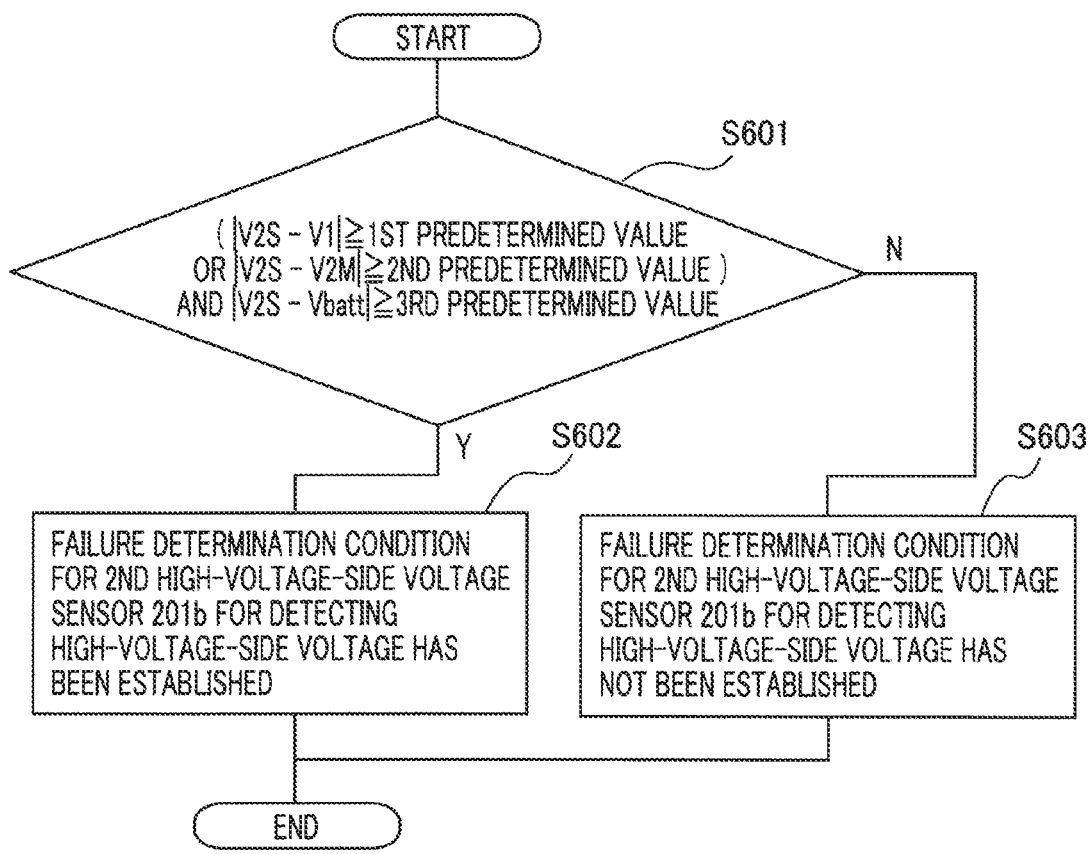
FIG. 3 is a flowchart representing the processing flow of a failure determination on a second high-voltage-side voltage sensor in the DC/DC converter according to Embodiment 1.

Next, there will be explained a failure determination on the second high-voltage-side voltage sensor 201b, performed by the failure detection means 301 provided in the control apparatus 300. FIG. 3 is a flowchart representing the processing flow of the failure determination on the second high-voltage-side voltage sensor in the DC/DC converter according to Embodiment 1.

In FIG. 3, in the step S601, the failure detector 302 performs a determination [whether or not the absolute value of the difference between the second high-voltage-side detection voltage V2S and the low-voltage-side detection voltage V1 is the same as or larger than the first predetermined value], a determination [whether or not the absolute value of the difference between the second high-voltage-side detection voltage V2S and the first high-voltage-side detection voltage V2M is the same as or larger than the second predetermined value], and a determination [whether or not the absolute value of the difference between the second high-voltage-side detection voltage V2S and the battery detection voltage Vbatt is the same as or larger than the third predetermined value]. In this situation, the first, second, and third predetermined values are the same as the foregoing first, second, and third predetermined values in FIG. 2.

In the case where in the determinations in the step S601, it is determined that [the absolute value of the difference between the second high-voltage-side detection voltage V2S and the low-voltage-side detection voltage V1 is the same as or larger than the preliminarily set first predetermined value] or that [the absolute value of the difference between the second high-voltage-side detection voltage V2S and the first high-voltage-side detection voltage V2M is the same as or larger than the preliminarily set second predetermined value] and it is determined that [the absolute value of the difference between the second high-voltage-side detection voltage V2S and the battery detection voltage Vbatt is the same as or larger than the preliminarily set third predetermined value] (Y), the step S601 is followed by the step S602, where it is determined that because the failure determination condition for the second high-voltage-side voltage sensor 201b for detecting the high-voltage-side voltage is established, the second high-voltage-side voltage sensor 201b has a failure.

In the case where in the determinations in the step S601, it is determined that [the absolute value of the difference between the second high-voltage-side detection voltage V2S and the low-voltage-side detection voltage V1 is smaller than the preliminarily set first predetermined value] and that [the absolute value of the difference between the second high-voltage-side detection voltage V2S and the first high-voltage-side detection voltage V2M is smaller than the preliminarily set second predetermined value] and it is further determined that [the absolute value of the difference between the second high-voltage-side detection voltage V2S and the battery detection voltage Vbatt is smaller than the preliminarily set third predetermined value] (N), the step S601 is followed by the step S603, where it is determined that because the failure determination condition for the second high-voltage-side voltage sensor 201b for detecting the high-voltage-side voltage is not established, the second high-voltage-side voltage sensor 201b is normal.

Figure 4:
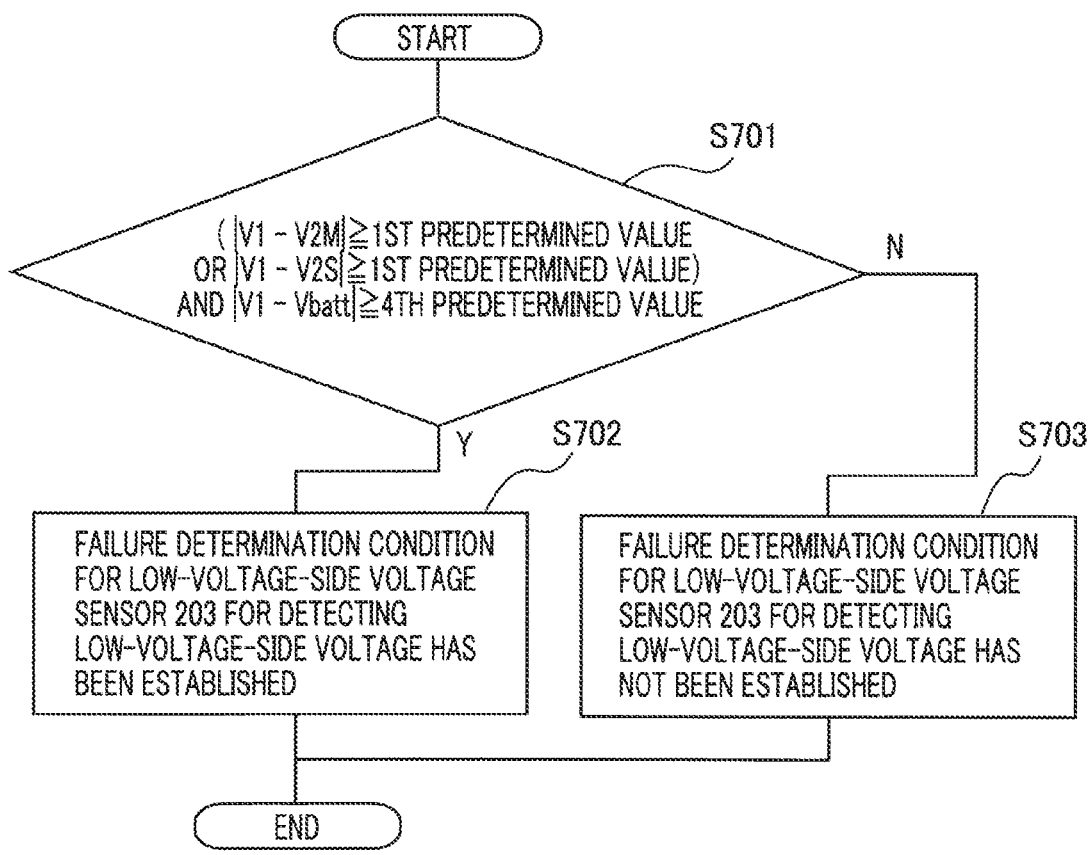
FIG. 4 is a flowchart representing the processing flow of a failure determination on a low-voltage-side voltage sensor in the DC/DC converter according to Embodiment 1.

Next, there will be explained a failure determination on the low-voltage-side voltage sensor 203, performed by the failure detection means 301 provided in the control apparatus 300. FIG. 4 is a flowchart representing the processing flow of a failure determination on a low-voltage-side voltage sensor in the DC/DC converter according to Embodiment 1.

In FIG. 4, in the step S701, the failure detector 302 perform a determination [whether or not the absolute value of the difference between the low-voltage-side detection voltage V1 and the first high-voltage-side detection voltage V2M is the same as or larger than the first predetermined value], a determination [whether or not the absolute value of the difference between the low-voltage-side detection voltage V1and the second high-voltage-side detection voltage V2S is the same as or larger than the first predetermined value], and a determination [whether or not the absolute value of the difference between the low-voltage-side detection voltage V1 and the battery detection voltage Vbatt is the same as or larger than a fourth predetermined value]. In this situation, the first predetermined value is the same as the foregoing first predetermined value; the fourth predetermined value is a preliminarily set value and is different from each of the foregoing first, second, and third predetermined values.

In the case where in the determinations in the step S701, it is determined that [the absolute value of the difference between the low-voltage-side detection voltage V1 and the first high-voltage-side detection voltage V2M is the same as or larger than the preliminarily set first predetermined value] or that [the absolute value of the difference between the low-voltage-side detection voltage V1 and the second high-voltage-side detection voltage V2S is the same as or larger than the preliminarily set first predetermined value] and it is determined that [the absolute value of the difference between the low-voltage-side detection voltage V1 and the battery detection voltage Vbatt is the same as or larger than the preliminarily set fourth predetermined value] (Y), the step S701 is followed by the step S702, where it is determined that because the failure determination condition for the low-voltage-side voltage sensor 203 for detecting the low-voltage-side voltage is established, the low-voltage-side voltage sensor 203 has a failure.

In the case where in the determinations in the step S701, it is determined that [the absolute value of the difference between the low-voltage-side detection voltage V1 and the first high-voltage-side detection voltage V2M is smaller than the preliminarily set first predetermined value] and that [the absolute value of the difference between the low-voltage-side detection voltage V1 and the second high-voltage-side detection voltage V2S is smaller than the preliminarily set first predetermined value] and it is further determined that [the absolute value of the difference between the low-voltage-side detection voltage V1 and the battery detection voltage Vbatt is smaller than the preliminarily set fourth predetermined value] (N), the step S701 is followed by the step S703, where it is determined that because the failure determination condition for the low-voltage-side voltage sensor 203 for detecting the low-voltage-side voltage is not established, the low-voltage-side voltage sensor 203 is normal.

In such a manner as described above, the failure detection means 301 in the control apparatus 300 performs the determination whether or not the first high-voltage-side voltage sensor 201a for detecting the high-voltage-side voltage has a failure, the determination whether or not the second high-voltage-side voltage sensor 201b for detecting the high-voltage-side voltage has a failure, and the determination whether or not the low-voltage-side voltage sensor 203 for detecting the low-voltage-side voltage has a failure.

When the failure detection means 301 determines that only any one of the first high-voltage-side voltage sensor 201a, the second high-voltage-side voltage sensor 201b, and the low-voltage-side voltage sensor 203 has a failure, the control apparatus 300 fixes the first switching device 103, which is the low-voltage-side semiconductor switching device of the semiconductor module 107 in the DC/DC converter main body 100, to the ON state. As a result, the reactor 102 continues generating energy, and hence it is made possible operation.

When the failure detection means 301 detects any two or more of the first high-voltage-side voltage sensor 201a, the second high-voltage-side voltage sensor 201b, and the low-voltage-side voltage sensor 203 has a failure, the control apparatus 300 fixes the first switching device 103 to the OFF state. As a result, the reactor 102 stops generating energy, and hence the DC/DC converter main body 100 is made to stop its voltage step-up operation.

In the processing represented in each of FIGS. 2, 3, and 4, in order to make the detection value of the high-voltage-side voltage equivalent to the low-voltage-side voltage while the DC/DC converter main body 100 performs its voltage step-up operation, the determination is performed by utilizing a value, as the first high-voltage-side detection voltage V2M, obtained by multiplying the detection value of the first high-voltage-side voltage sensor 201a for detecting the high-voltage-side voltage by [1—the On duty of the first switching device 103], and the determination is performed by utilizing a value, as the second high-voltage-side detection voltage V2S, obtained by multiplying the detection value of the second high-voltage-side voltage sensor 201b for detecting the high-voltage-side voltage by [1—the On duty of the first switching device 103].

As described above, even in the case where any two of the first high-voltage-side voltage sensor 201a for detecting the high-voltage-side voltage, the second high-voltage-side voltage sensor 201b for detecting the high-voltage-side voltage, and the low-voltage-side voltage sensor 203 for detecting the low-voltage-side voltage have failures, no erroneous determination on the failure portion occurs. Thus, even in the case where any one of the first high-voltage-side voltage sensor 201a for detecting the high-voltage-side voltage, the second high-voltage-side voltage sensor 201b for detecting the high-voltage-side voltage, and the low-voltage-side voltage sensor 203 for detecting the low-voltage-side voltage has a failure, gate-on operation of the DC/DC converter main body 100 can be implemented.

Thus, in the case where any one of the first high-voltage-side voltage sensor 201a for detecting the battery detection voltage Vbatt and the high-voltage-side voltage, the second high-voltage-side voltage sensor 201b for detecting battery detection voltage Vbatt and the high-voltage-side voltage, and the low-voltage-side voltage sensor 203 for detecting battery detection voltage Vbatt and the low-voltage-side voltage has a failure, all of the failure determination conditions are established and hence the failure portion cannot be determined; however, no circuit in the DC/DC converter main body 100 is broken.

Although the present disclosure is described above is terms of an exemplary embodiment, it should be understood that the various features, aspects and functions described is the embodiment are not limited in their applicability to the particular embodiment with which they are described, but instead can be applied, alone or is various combinations to the embodiment. It is therefore understood that numerous modifications which have not been exemplified can be devised without departing from the scope of the present application. For example, at least one of the constituent components may be modified, added, or eliminated.

What is claimed is:

1. A DC/DC converter comprising:
   a DC/DC converter main body that performs voltage conversion operation for converting a DC input-side voltage into a DC output-side voltage having a different value; and
   a control apparatus that controls the voltage conversion operation by the DC/DC converter main body,
   wherein the DC/DC converter main body includes
      an input terminal with which a DC power source is connected,
      a reactor having one end connected with the input terminal,
      a switching circuit in which a first switching device and a second switching device are provided and in which an other end of the reactor is connected with a connection portion between the first switching device and the second switching device,
      an energy accumulator to accumulate energy of the reactor, generated through switching operation by the first switching device, via the second switching device,
      an output terminal from which a voltage of the energy accumulator is outputted as the DC output-side voltage,
      an input-side voltage sensor that detects the DC input-side voltage,
      a first output-side voltage sensor that detects the DC output-side voltage,
      a second output-side voltage sensor that detects the DC output-side voltage, and
      a DC power source voltage sensor that detects a voltage of the DC power source,
   wherein based on a command value from the outside the DC/DC converter, a detection value of the input-side voltage sensor, and at least one of a detection value of the first output-side voltage sensor and a detection value of the second output-side voltage sensor, the control apparatus controls switching of the first switching device and the second switching device, thereby controlling the voltage conversion operation,
   wherein the control apparatus further has a failure detector to detect a failure in at least one of the input-side voltage sensor, the first output-side voltage sensor, and the second output-side voltage sensor, and
   wherein the failure detector performs a determination on the failure, based on the detection value of the input-side voltage sensor, the detection value of the first output-side voltage sensor, the detection value of the second output-side voltage sensor, and a detection value of the DC power source voltage sensor.

2. The DC/DC converter according to claim 1,
   wherein the failure detector includes an input-side voltage detector that outputs an input-side detection voltage, based on the detection value of the input-side voltage sensor, a first output-side voltage detector that outputs a first output-side detection voltage, based on the detection value of the first output-side voltage sensor, a second output-side voltage detector that outputs a second output-side detection voltage, based on the detection value of the second output-side voltage sensor, and a DC power source voltage detector that outputs a DC power source detection voltage, based on the detection value of the DC power source voltage sensor, and wherein a failure in the first output-side voltage sensor is detected based on an absolute value of a difference between the first output-side detection voltage and the DC power source detection voltage and any one of an absolute value of a difference between the first output-side detection voltage and the input-side detection voltage and an absolute value of a difference between the first output-side detection voltage and the second output-side detection voltage.

3. The DC/DC converter according to claim 2, wherein when the failure detector detects a failure in only any one of the first output-side voltage sensor, the second output-side voltage sensor, and the input-side voltage sensor, the control apparatus fixes the first switching device to an ON state.

4. The DC/DC converter according to claim 2, wherein when the failure detector detects failures in any two or more of the first output-side voltage sensor, the second output-side voltage sensor, and the input-side voltage sensor, the control apparatus fixes the first switching device to an OFF state.

5. The DC/DC converter according to claim 2, wherein while the voltage conversion operation is performed, a value obtained by multiplying the first output-side detection voltage by [1—an ON-time duty of the first switching device] is utilized instead of the value of the first output-side detection voltage and a value obtained by multiplying the second output-side detection voltage by [1—an ON-time duty of the first switching device] is utilized instead of the value of the second output-side detection voltage.

6. The DC/DC converter according to claim 1, wherein the failure detector includes
    an input-side voltage detector that outputs an input-side detection voltage, based on the detection value of the input-side voltage sensor,
    a first output-side voltage detector that outputs a first output-side detection voltage, based on the detection value of the first output-side voltage sensor,
    a second output-side voltage detector that outputs a second output-side detection voltage, based on the detection value of the second output-side voltage sensor, and
    a DC power source voltage detector that outputs a DC power source detection voltage, based on the detection value of the DC power source voltage sensor, and
wherein a failure in the second output-side voltage sensor is detected based on an absolute value of a difference between the second output-side detection voltage and the DC power source detection voltage and any one of an absolute value of a difference between the second output-side detection voltage and the input-side detection voltage and an absolute value of a difference between the second output-side detection voltage and the first output-side detection voltage.

7. The DC/DC converter according to claim 6, wherein when the failure detector detects a failure in only any one of the first output-side voltage sensor, the second output-side voltage sensor, and the input-side voltage sensor, the control apparatus fixes the first switching device to an ON state.

8. The DC/DC converter according to claim 6, wherein when the failure detector detects failures in any two or more of the first output-side voltage sensor, the second output-side voltage sensor, and the input-side voltage sensor, the control apparatus fixes the first switching device to an OFF state.

9. The DC/DC converter according to claim 6, wherein while the voltage conversion operation is performed, a value obtained by multiplying the first output-side detection voltage by [1—an ON-time duty of the first switching device] is utilized instead of the value of the first output-side detection voltage and a value obtained by multiplying the second output-side detection voltage by [1—an ON-time duty of the first switching device] is utilized instead of the value of the second output-side detection voltage.

10. The DC/DC converter according to claim 1,
    wherein the failure detector includes
        an input-side voltage detector that outputs an input-side detection voltage, based on the detection value of the input-side voltage sensor,
        a first output-side voltage detector that outputs a first output-side detection voltage, based on the detection value of the first output-side voltage sensor,
        a second output-side voltage detector that outputs a second output-side detection voltage, based on the detection value of the second output-side voltage sensor, and
        a DC power source voltage detector that outputs a DC power source detection voltage, based on the detection value of the DC power source voltage sensor, and
    wherein a failure in the input-side voltage sensor is detected based on an absolute value of a difference between the input-side detection voltage and the DC power source detection voltage and any one of an absolute value of a difference between the first output-side detection voltage and the input-side detection voltage and an absolute value of a difference between the input-side detection voltage and the second output-side detection voltage.

11. The DC/DC converter according to claim 10, wherein when the failure detector detects a failure in only any one of the first output-side voltage sensor, the second output-side voltage sensor, and the input-side voltage sensor, the control apparatus fixes the first switching device to an ON state.

12. The DC/DC converter according to claim 10, wherein when the failure detector detects failures in any two or more of the first output-side voltage sensor, the second output-side voltage sensor, and the input-side voltage sensor, the control apparatus fixes the first switching device to an OFF state.

13. The DC/DC converter according to claim 10, wherein while the voltage conversion operation is performed, a value obtained by multiplying the first output-side detection voltage by [1—an ON-time duty of the first switching device] is utilized instead of the value of the first output-side detection voltage and a value obtained by multiplying the second output-side detection voltage by [1—an ON-time duty of the first switching device] is utilized instead of the value of the second output-side detection voltage.

14. The DC/DC converter according to claim 1, wherein when the failure detector detects a failure in only any one of the first output-side voltage sensor, the second output-side voltage sensor, and the input-side voltage sensor, the control apparatus fixes the first switching device to an ON state.

15. The DC/DC converter according to claim 14, wherein when the failure detector detects failures in any two or more of the first output-side voltage sensor, the second output-side voltage sensor, and the input-side voltage sensor, the control apparatus fixes the first switching device to an OFF state.

16. The DC/DC converter according to claim 1, wherein when the failure detector detects failures in any two or more of the first output-side voltage sensor, the second output-side voltage sensor, and the input-side voltage sensor, the control apparatus fixes the first switching device to an OFF state.

* * * * *